US009291729B2

(12) United States Patent
Pichot et al.

(10) Patent No.: US 9,291,729 B2
(45) Date of Patent: Mar. 22, 2016

(54) MODULE FOR PROCESSING GEOPHYSICAL DATA COMPRISING TWO CONNECTORS EACH FORMING ONE HALF-SHELL AND BEING ARRANGED TO FORM A SHELL IN WHICH AN ELECTRONIC BOARD IS PLACED, CONNECTOR AND SUB-ASSEMBLY CORRESPONDING

(75) Inventors: Yann Pichot, Orvault (FR); Johann Dabouineau, Villeneuve de Riviere (FR)

(73) Assignee: Sercel, Carquefou (FR)

(*) Notice: Subject to any disclaimer, the term of this patent is extended or adjusted under 35 U.S.C. 154(b) by 211 days.

(21) Appl. No.: 14/115,567

(22) PCT Filed: May 4, 2012

(86) PCT No.: PCT/EP2012/058215
§ 371 (c)(1),
(2), (4) Date: Feb. 21, 2014

(87) PCT Pub. No.: WO2012/150324
PCT Pub. Date: Nov. 8, 2012

(65) Prior Publication Data
US 2014/0153170 A1 Jun. 5, 2014

(30) Foreign Application Priority Data
May 4, 2011 (EP) .................................... 11164839

(51) Int. Cl.
*H05K 5/00* (2006.01)
*G01V 1/16* (2006.01)
*G01V 1/20* (2006.01)

(52) U.S. Cl.
CPC ................ *G01V 1/164* (2013.01); *G01V 1/201* (2013.01); *H05K 5/0069* (2013.01)

(58) Field of Classification Search
CPC ................................. H05K 5/00; H05K 7/142
USPC ......................................................... 361/752
See application file for complete search history.

(56) References Cited

U.S. PATENT DOCUMENTS 3,350,678 A * 10/1967 McLoad ....................... 439/624
6,786,297 B1 * 9/2004 Menard ........................ 181/112
(Continued)

FOREIGN PATENT DOCUMENTS

EP 1145045 B1 3/2004
GB 2460349 A 12/2009

OTHER PUBLICATIONS

International Preliminary Report on Patentability and Written Opinion dated Nov. 5, 2013 for corresponding International Patent Application No. PCT/EP2012/058215, filed May 4, 2012.
(Continued)

*Primary Examiner* — Forrest M Phillips
(74) *Attorney, Agent, or Firm* — David D. Brush; Westman Champlin & Koehler, P.A.

(57) ABSTRACT

A module is provided for processing geophysical data coming from at least one geophysical sensor. The module includes: an electronic board configured to enable the processing of geophysical data captured by the at least one geophysical sensor; and two cable sections each including, at one extremity, a connector designed to be connected to said electronic board. Each connector forms one half-shell and is arranged so as to cooperate with one other half-shell in such a way as to form a shell in which the electronic board is placed.

20 Claims, 10 Drawing Sheets

(56) References Cited

U.S. PATENT DOCUMENTS

| | | |
|---|---|---|
| 2007/0177459 A1 | 8/2007 | Behn et al. |
| 2008/0117614 A1* | 5/2008 | Qin et al. .................. 361/807 |
| 2009/0255726 A1* | 10/2009 | Yang ........................ 174/544 |
| 2010/0142163 A1* | 6/2010 | Uemura et al. ............. 361/752 |

OTHER PUBLICATIONS

European Search Report and Written Opinion dated Apr. 20, 2012 for corresponding European Patent Application No. 11164839, filed May 4, 2011.

* cited by examiner

MODULE FOR PROCESSING GEOPHYSICAL DATA COMPRISING TWO CONNECTORS EACH FORMING ONE HALF-SHELL AND BEING ARRANGED TO FORM A SHELL IN WHICH AN ELECTRONIC BOARD IS PLACED, CONNECTOR AND SUB-ASSEMBLY CORRESPONDING

CROSS-REFERENCE TO RELATED APPLICATIONS

This application is a Section 371 National Stage application of International application No. PCT/EP2012/058215, filed May 4, 2012, which is incorporated by reference in its entirety and published as WO 2012/150324 on Nov. 8, 2012, in English.

STATEMENT REGARDING FEDERALLY SPONSORED RESEARCH OR DEVELOPMENT

None.

THE NAMES OF PARTIES TO A JOINT RESEARCH AGREEMENT

None.

FIELD OF THE DISCLOSURE

The present invention pertains to geophysical data acquisition systems.

These systems generally use a plurality of electronic modules that process signal received from seismic sensors. These sensors are chosen among velocimeters (e.g., geophones), accelerometers (e.g., MEMS), hydrophones or any sensor known in the art.

BACKGROUND OF THE DISCLOSURE

Prior art systems may be designed according to the following architecture, which shall be described in detail with reference to FIGS. 1a and 1b.

FIG. 1a describes architecture of one electronic module 1 as discussed in the patent document EP-1145045. This electronic module 1 comprises:
- a cover 2 and one electronic board 3 used to digitize and process the data captured by each sensor;
- two type of cable sections 4 described in more details in relation with the FIG. 1b;
- load distribution means relying on the existence of a rigid part consisting of a metal plate 7, fixed to the connectors 6 thanks to hooking means and studs 8, 9;
- tight sealing for the interfaces;
- a means of connection 10 for the connection of at least one sensor (not shown).

It is well understood that other configurations can be made with more than one electronic module (FIG. 1a), for example three electronic modules 1000, 10000 as described in FIG. 1b, thus forming a "link" 100.

This link 100 comprises two types of electronic module 1000, 10000, each one comprising:
- a cover 2 and one electronic board 3 used to digitize and process the data captured by each sensor;
- two cable sections;
- load distribution means relying on the existence of a rigid part consisting of a metal plate 7, fixed to the connectors 6 thanks to hooking means and studs 8, 9;
- tight sealing for the interfaces;
- a means of connection 10 for the connection of at least one sensor (not shown).

More precisely, the first type of electronic module 1000 comprises two types of cable section:
- a first cable section 4 with:
  - at its first extremity, one connector 6 providing the electrical link between the cable 4 and the electronic board 3 positioned inside the cover 2 of the module 1000; and
  - at its second extremity, one end-of-section hermaphrodite connector 5 adapted to be connected to one other end-of section hermaphrodite connector 5 of one other cable section 4;
- a second cable section 40 with:
  - at its first extremity, one connector 6 providing the electrical link between the cable 4 and the electronic board 3 positioned inside the cover 2 of the module 1000; and
  - at its second extremity, one other connector 6 providing the electrical link between the cable 40 and the electronic board 3 of one other module 10000.

More precisely, the second type of electronic module 10000 comprises two identical cable section 40 as described above, each one comprising at its first extremity, one connector 6 providing the electrical link between the cable 40 and the electronic board 3 positioned inside the cover 2 of the module 10000, and at its second extremity, one other connector 6 providing the electrical link between the cable 40 and the electronic board 3 of one other module 1000.

It has to be noted that electronics module should be the same within the same link.

This type of geophysical data acquisition systems using a multitude of these types of electronic modules as defined above performs very well and provides an effective response to market request which requires ease of portability and mechanical robustness during transport and handling, under tensile or bending forces exerted on the cable sections as well as under compressive forces exerted on the cover 2.

Easy portability is characterized by a system having the lowest possible linear mass density and space requirement and high flexibility, and requires only a small workforce for installation.

Mechanical robustness under stress is characterized by the functionality of the cover 2, the connector 6 and the electronic board 3 under a given stress or after it has undergone stress, to remain operational. In certain cases, robustness is also characterized by the preservation of the functions of the electronic board 3 after breakage of the cover 2 under stress, for example under crushing force.

The mechanical behavior of the electronic module 1 as described hitherto differs according to the load applied as shown in FIGS. 2 a-f. More precisely, the value of the moment of inertia of the electronic board 3 is well adapted to characterize the mechanical behavior of the electronic module 1. Indeed, it has to be considered that the moment of inertia characterizes the ability of the geometry of the part, and particularly its cross-section, to withstand mechanical constraints such as bending. In case of a rectangular section, the moment of inertia is proportional to the width and the cube of the thickness as follows:

$$I=(W*T^3)/12,$$

where I corresponds to the moment of Inertia, W the width and T the thickness.

FIG. 2a is a schematic lateral view of the electronic module 1 which undergoes one vertical fall (or vertical impact) (see the arrow F1 on FIG. 2a which shows the direction of this fall/impact). When there is a vertical impact, this one acts on bottom external faces 11 of the connector 6. These surfaces are plane surfaces. The energy transmitted is therefore absorbed by the whole corresponding surface. The deformation of this surface is therefore fairly small. Nevertheless, the moment of inertia subjected to the acceleration of the impact is the minimum moment of the board (as calculated below). The deformation of the electronic board 3 is therefore high, and one bending force is imposed on the electronic components of the electronic board 3.

To illustrate this case, let us consider now an electronic board 3 having a width W of the section characterized by the length 31, typically 75 mm (for example), and a thickness T characterized by the edge length 32, typically 1.6 mm (for example). The value of the resulting moment of inertia is 25.6 mm$^4$ on the above configuration FIG. 2b is a schematic top view of the electronic module 1 and the stress undergone by the cover 2 in a lateral fall (see the arrow F2 for the direction illustrating a fall). During a lateral fall, the electronic module 1 falls on a rigid external face 12 of the cover 2. Because the external face 12 is made of rigid material, the energy of the fall is absorbed to only a small extent and the acceleration to which the electronic board 3 is subjected is therefore the maximum. As the direction of the impact changes, the dimensions to consider defining the moment of inertia change, particularly the thickness.

If we take the same configuration as described above, the value of the width W still equals to 75 mm, same as describes for a vertical impact, but the value of the thickness T changes to 45 mm (that is to say corresponding to the electronic board 3 width). The value of the resulting moment of inertia is then 569 531.2 mm$^4$.

As can be seen, the value of the moment of inertia of the electronic board 3 for a vertical fall (FIG. 2a) is less important than the value of the moment of inertia for a lateral fall (FIG. 2b). According to the above definition of the moment of inertia, the deformation of the electronic board 3 is therefore less important in the configuration of FIG. 2b.

In other words, during an impact and in order to reduce the deformation undergone by the electronic board, it is better to place the electronic board perpendicularly to the ground.

FIG. 2c shows a schematic side view of the electronic module 1 and the cover 2 undergoes one tensile or pulling force (illustrated by the arrow F3). Under tensile forces exerted on the cable 4, the main part of the force is transmitted to the cable sections 4 through the load-distributing studs 8, 9 and the plate 7 (illustrated by the arrows F3b). The cover 2 has to cope with very little tension. The electronic board 3, as mounted on the plate 7, should cope with small constraints.

FIGS. 2d and 2e are schematic side views of the electronic module 1 and show the stress undergone by the cover 2 under bending forces towards or opposite to the cover 2 (illustrated by the arrows F4 and F5). A support 13 is situated on the cover 2 of the electronic module 1 (FIG. 2e), or beneath the electronic module 1 in contact with one face of the connector 6 (FIG. 2e). Under a bending force towards or in opposite direction of the cover 2, the resulting forces through the connector 6 are in opposite direction and give rise to a tensile component (see arrows F4a, F5a) at the junction between each cable 4 and each connector 6, or compressive component (see arrows F4b, F5b) at the fastenings of the connector 6 with the plate 7. The plate 7 undergoes bending moments at its extremities.

FIG. 2f is a schematic side view of the electronic module 1 and the stress undergone by cover 2 during compression (illustrated by the arrow F6). During the compression of the cover 2, bending forces are created at the fastenings of the connectors 6. The plate 7 limits these forces by limiting the rotation of the fastenings. The compression is directly transferred to the connectors 6 in the form of a compressive stress (see arrows F6b) and a tensile stress (see arrow F6a) at the junction between each cable 4 and each connector 6.

The number of fastenings (as screws for example) needed to fix the cover to the connectors 6 described here above is important (eight screws in this example of the patent document EP-1145045) in order to withstand numerous forces that go through, as illustrated in FIGS. 2d to 2f. This entails penalties for repairing and troubleshooting.

Thus, the acquisition module described in EP1145045 requires that the design of the different parts should account for a multitude of different forces depending on the load applied to the electronic module 1. The portability is good because of the small space requirement and small weight of the module. However, ease of assembly is penalized by the number of fastenings needed.

Furthermore, the electrical link between the connectors 6 and the electronic board 3 is obtained by means of a connection point on the electronic board that is provided, for a given connector, on the corresponding extremity of the electronic board. The electronic board and the layout of the components on the board therefore take the position of these connection points into consideration. This results in superfluous space being taken on the electronic board.

SUMMARY

An exemplary embodiment of the invention proposes a module for processing geophysical data. This module comprises an electronic board configured to enable the processing of geophysical data captured by said at least one geophysical sensor and two cable sections each comprising, at one extremity, a connector designed to be connected to the board. Each connector forms a half-shell arranged so as to cooperate with one other half-shell in such a way as to form a shell in which the electronic board is placed.

Thus, according to the invention, it is possible to obtain a module for processing geophysical data, the robustness of which is substantially increased as compared with prior art modules.

Furthermore, the connectors are directly and rigidly fixed to one other, enabling the forces exerted on the cable to travel preponderantly through the connectors while limiting the stresses on the electronic board itself.

Furthermore, as shall be seen more clearly here below, the time needed to assemble the electronic modules according to the invention is small as compared with the prior art modules, therefore providing for a gain in time for troubleshooting and therefore a gain regarding the dead-time due to equipment failure during operation.

According to an advantageous embodiment, the module comprises a top cover and a bottom cover arranged so as to form a sub-assembly in which the electronic board is placed. In this case, said sub-assembly is held by the shell-forming connectors.

The maintenance (disassembly and reassembly) of such a module is therefore much easier and can be performed quickly. Indeed, the operator does not need to unscrew a huge number of screws when it is necessary to operate on the module for maintenance.

According to a preferred embodiment of the invention, the electronic board is positioned longitudinally along the axis formed by the cable sections, laterally surrounded by the shell-forming connectors. The electronic board can extend vertically between the shell-forming connectors.

Positioning the board vertically in the module maximizes its moment of inertia in the vertical axis of the acquisition module. The deformation of the board in a vertical impact is thus minimized.

According to a preferred embodiment, the connectors forming said shell are identical and are positioned symmetrically with regard to said vertical axis.

Therefore, the assembly of the module is facilitated and the manufacturing cost is reduced. According to a preferred embodiment of the invention, said bottom cover comprises at least one slot arranged so as to hold the electronic board vertically.

Thus, the electronic board is maintained firmly when the module is throwed on the ground.

According to an advantageous approach of the invention, the electronic board comprises at least one electrical connection point for each connector, said at least electrical connection points being laid out in a central region of said electronic board. Preferably, the electronic connection points of the electronic board are laid out in the vicinity of one other.

Thus, the design of the board and the layout of the components, is facilitated by the presence of the two connection points directly in the vicinity of one other. This implementation helps for a better robustness of the electronic board against environmental stresses such as lightning discharge.

According to a preferred embodiment, the bottom cover, the top cover and the connectors cooperate so as to form a tightly sealed shell around the electronic board.

More precisely, the electronic board is firstly placed vertically in the slot of said bottom cover. Once placed, the top cover is placed around the electronic board. In this case, the top cover advantageously forms a covering element in which the electronic board is placed, this covering element resting on the bottom cover. One sub-assembly is therefore created. The connectors are afterwards mounted around this sub-assembly to form a shell.

Advantageously, said top cover comprises an orifice compared with each face of the electronic board, providing each with the link between one of the connectors and one connection point of the board.

According to a preferred embodiment, each connector comprises one external face made out of flexible material and one internal face made out of rigid material. Advantageously, each connector comprises one strip at its lower face made out of flexible material. In particular, the hardness of said external face and internal face respectively belong to the ranges of 60 to 90 Shore A and 60 to 90 Shore D, and that the hardness of said on strip belong to the ranges of 60 to 90 Shore A.

In a first embodiment, said at least one geophysical sensor comprises at least one geophone. In a second embodiment, said at least one geophysical sensor comprises at least one MEMS sensor.

According to an advantageous embodiment, each cable section comprises:
  one end-of-section hermaphrodite connector adapted to be connected to one other end-of section hermaphrodite connector of one other cable section; and
  one connector providing an electrical link between the cable section and the electronic board positioned inside the cover.

According to another embodiment, each cable section comprises at each of its extremities one connector providing an electrical link between the cable section and the electronic board positioned inside the cover.

The invention also relates to a connector forming a half-shell and arranged so as to cooperate with one other connector forming another half-shell so as to form a shell in which an electronic board of a module as described above is placed.

The invention also relates to a bottom and a top cover cooperating together to form a sub-assembly in which an electronic board of a module as described above is placed and held.

BRIEF DESCRIPTION OF THE DRAWINGS

Other aspects, aims and advantages of the present invention shall appear more clearly from the following detailed description of a preferred embodiment, given by way of an example and made with reference to FIGS. 3 to 5 of the appended drawings, of which.

DETAILED DESCRIPTION OF ILLUSTRATIVE EMBODIMENTS

Figure 3:
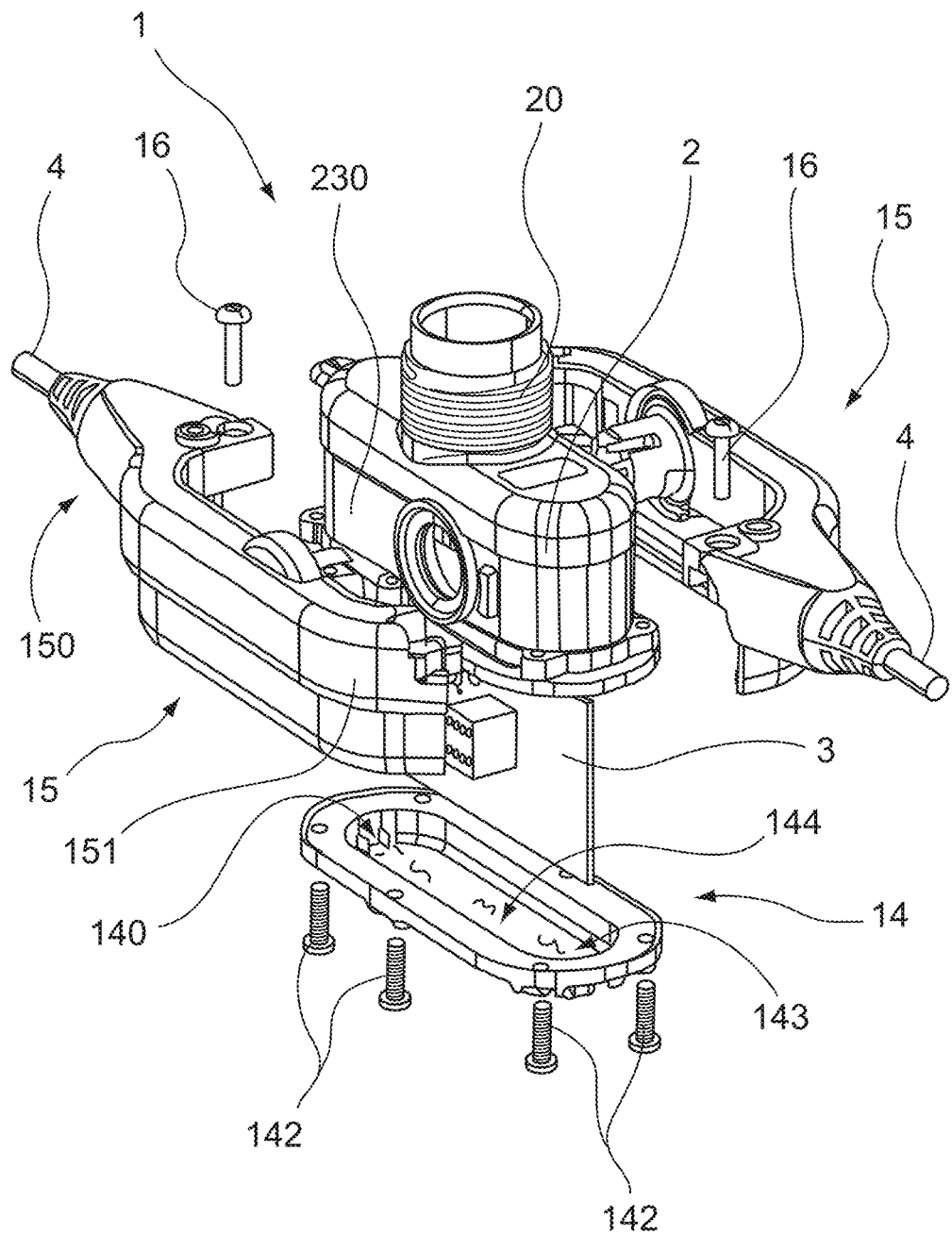
FIG. 3 is a view of a first embodiment of a geophysical data processing module, also called electronic module, according to the present invention.

Referring to FIG. 3, a geophysical data processing module 1, also called electronic module 1 later on the description, comprises:
  a top cover 2;
  a connection means 20 designed to be connected to at least one geophysical data sensor (not shown);
  an electronic board 3 configured to enable the processing of geophysical data captured by the at least one geophysical data sensor (such as geophones, MEMS or the like) connected to the connection means 20;
  two cable sections 4 each bearing a connector 15 at one of their extremities, designed to be connected to the electronic board 3.

It is to be noted that the sensor can be integrated inside said electronic module. This configuration will be described in more details afterwards, in relation with the FIG. 9.

The module 1 of FIG. 3 can be made of two types of cable sections 4 (as described in relation with FIG. 1b), each one comprising:
  at its first extremity, a connector 15 providing the electrical link between the cable 4 and the electronic board 3 positioned inside the cover 2; and
  at its second extremity, one end-of-section hermaphrodite connector 5 adapted to be connected to one other end-of section hermaphrodite connector of one other cable section 4 of the tye described in relation with the prior art (see FIG. 1b), or one other connector 15 adapted to be connected to one other connector of one other module (not shown) forming a link.

According to a first embodiment illustrated by FIG. 3, the bottom cover 14 comprises a recess 144. This recess comprises at least one slot 140 (one slot in this example) at each of its longitudinal ends. To limit shock on the electronic board, some shock absorbers (not shown) may be placed inside the recess of the bottom cover 14 and get in contact with the electronic board 3 which is placed on the slots 140.

Once the electronic board is placed on the slots 140, this last is mounted vertically inside the top cover 2. The top cover 2 encompasses the electronic board 3. The bottom cover 14 closes the assembly formed by the top cover 2 and the electronic board 3, and provides it with tight sealing at its lower part.

Figure 7:
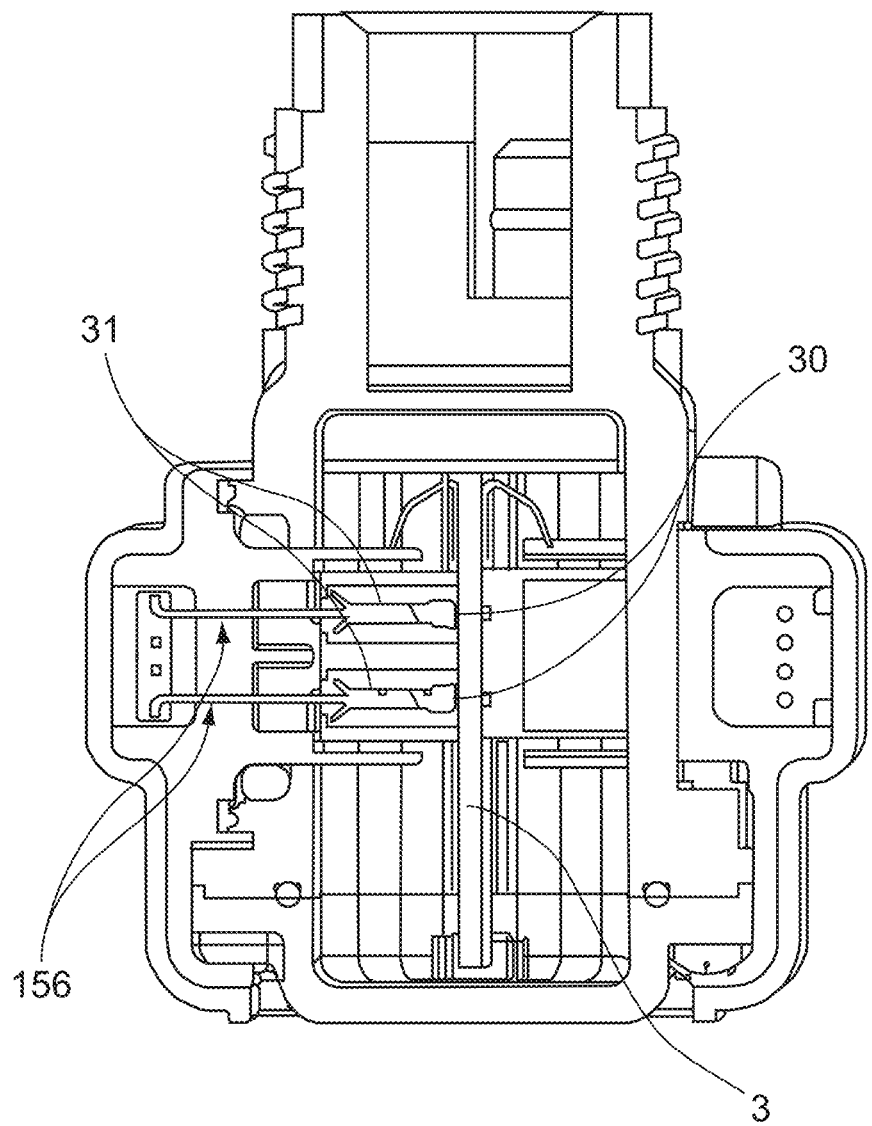
FIGS. 7 and 8 are cross-sectional views of the electronic module described in FIG. 3.

The connectors 15 get assembled around the sub-assembly formed by the top cover, the bottom cover and the electronic board. Each connector 15 is locked with one other connector 15 by means of fastening screws 16. The connectors 15 provide for an electrical link between the cable sections 4 and the electronic board 3 thanks to means of electrical connection points 30 on the electronic board 3 (FIG. 7). This electrical link is tightly sealed.

As can be seen in FIGS. 3, 4a, 4b and 5, the electronic board 3 is placed in the slots 140 (FIG. 3) of the bottom cover 14. Thus, the electronic board 3 is mounted vertically inside the top cover 2 or, in other words, perpendicular relative to the main plain of the bottom cover 14. Then, the top cover 2 is placed on the bottom cover 14. Consequently, the top cover 2 encompasses the electronic board 3. Also, the top cover 2 has a peripheral protrusion 21. It can be noted that the circumference defined by the peripheral protrusion 21 corresponds to the circumference of the main plane 141 of the bottom cover 14. The bottom cover 14 and the top cover 2 are assembled together by means of fastening screws 142 (FIG. 3), to form, with the electronic board, a sub-assembly. This sub-assembly is not intended to be disassembled during operation in the field. The connectors 15 are then assembled around the sub-assembly. There is no fastener linking the assembly made of the top cover 2 and the bottom cover 14 to the connector 15, the link is ensured by the sealing and the rest of the connector 15 on the top cover 2.

Figure 1A:
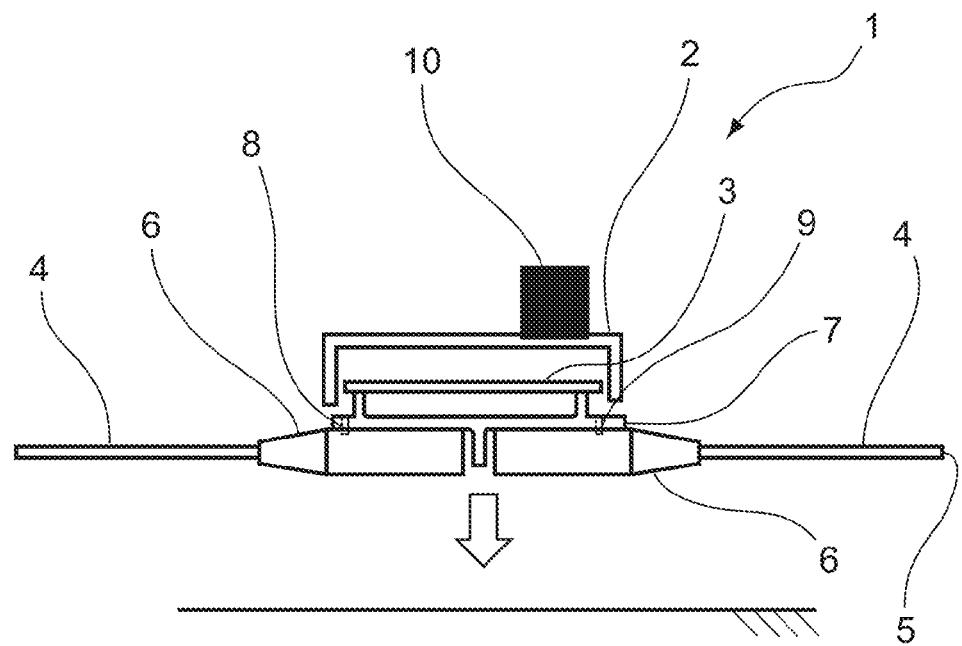
FIG. 1 shows the architecture of one prior art electronic (or acquisition) module.
Figure 1B:
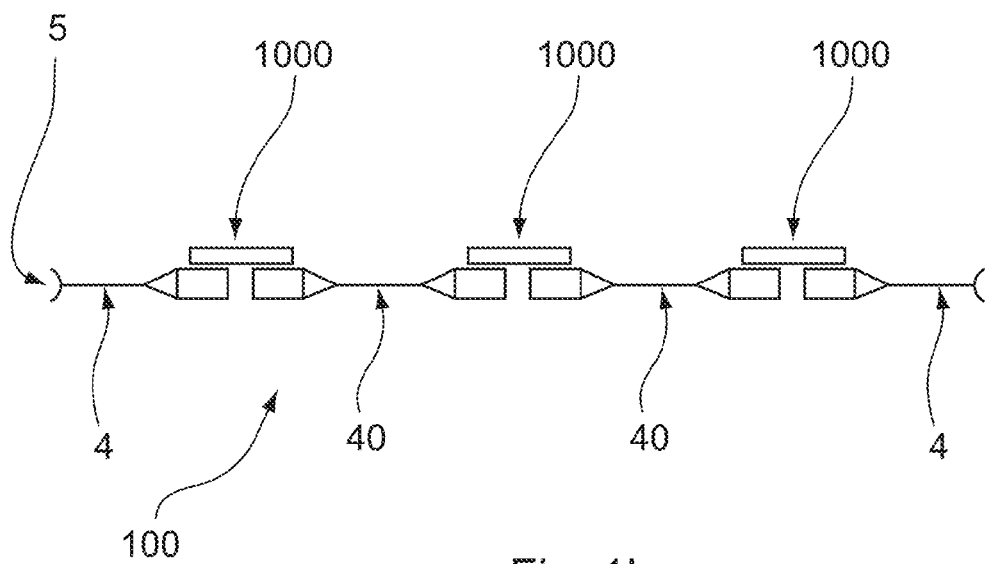

As described in the previous art of FIG. 1.b the configuration of such a module allows assembling several sub-assemblies with intermediate cable sections 4 or 40 in order to form a link.

The maintenance in the field is thus facilitated. In case of failure of an electronic board, one can replace the sub-assembly by disassembling the connectors 15. In case of failure of a cable section 4 or 40 (for example a cable cut), one can replace easily said cable section by another cable section 4 or 40 also by disassembling the connectors 15.

Furthermore, according to the principle of the invention, each connector 15 forms a half-shell arranged so as to cooperate with one other half-shell (i.e. the other connector 15) so that, together, they form a shell in which the electronic board 3 is positioned. In other words, the shape of the connectors 15 is designed so that when the connectors are assembled, they form a shell around the electronic board. The design of connectors 15 and the absence of fasteners between the connectors 15 and the top cover 2 prevent tension from happening in screws 16.

Furthermore, the sealing of the electrical link is ensured by a radial compression. The radial compression of an O-ring generates a pressure on the O-ring following its radius. This compression requires a controlled construction set between two parts, but no particular compression from any fastener (screw for instance). In comparison, another solution is used in the solution of the art as described on patent document EP-1145045. Referring to FIG. 1, the waterproofness between connector 6 and top cover 2 is ensured by an axial compression of the O-ring, which means a compression applied following the axis perpendicular to the radius of the O-ring. This compression is done by the mean of screws. The waterproofness of the assembly is therefore directly depending on the screws. The solution used on the present invention prevents the screws 16 used to join fixedly the two connectors 15 to participate to the waterproofness of the electrical link, and thus limit the risk of waterproofness failure (for instance, in case of torque loss on screws).

Furthermore when electronic modules 1 of the present invention are troubleshot on the field, the number of operations (assembling/disassembling) during troubleshooting (or maintenance) is greatly reduced, because only two screws 16 are used to fix the connectors 15 with the sub-assembly. Dead time for seismic operation is therefore improved.

Each connector has a proximal extremity 150 in the vicinity of a corresponding cable 4, and a distal extremity 151 opposite the proximal extremity (FIG. 3).

Fastening screws 16 fixedly join the two connectors 15 in such a way that the proximal extremity of a first of the two connectors is fixedly joined to the distal extremity of the other connector while the distal extremity of the first connector is coupled to the proximal extremity of the other connector. Moreover, in order to optimize contractor's productivity, it is important to allow a simple and quick troubleshooting of the equipment. As the connectors 15 are identical, and their positioning around the assembly of top cover 2 and bottom cover 14 is symmetrical, it allows a reversible connection of the connectors 15, that is to say one could be set in place of another. This helps the user to prevent any issues from happening, and decrease the repair time.

Furthermore, as can be seen in FIG. 3, the top cover 2 has an orifice 220 on each of its longitudinal faces 22. Connectors 15 have a cylindrical internal extension 152 sized so as to get housed in the orifice 220 corresponding to the top cover 2. The external diameter of the internal extension 152 corresponds to the diameter of the orifice 220 of the top cover 2.

Each cable 4 extends in this associated connector 15 and is connected to it thanks to at least one electrical link (not shown), for example a multitude of pins directly integrated to said associated connector 15. When the electronic module 1 is assembled, the cable 4 is connected to the electronic board 3 thanks to metallic pins 156 (forming male part) engaged in metallic housing 31 (forming female part) of the electronic board (FIG. 7).

The metallic housings 31 implemented on the electronic board 3 have also to be tolerant to the construction set of the assembly. It has to be noticed that the electronic board 3 is floating inside the top cover 2 when the connectors 15 are unmounted. Therefore, during the assembly of the first connector 15 with the second connector, the insertion of the metallic pins 156 of the connector 15 into the metallic housings 31 of the electronic board 3 will freeze the electronic board 3 position inside the top cover 2. The first connector 15 is referenced to the top cover 2, the metallic housings 31 of the electronic board 3 are therefore also referenced to the top cover 2. The assembly of the second connector 15 is also referenced to the top cover 2. Therefore, the construction set existing in between the connector 15 reference on the top cover 2 and the corresponding metallic housing 31 of the electronic board 3 has to be absorbed by said metallic housing. For instance, on the described design, the tolerance that these metallic housings have to meet is in the range of ±1 mm.

Furthermore, each connector has an inner flange 153 at the lower part of the connector. This inner flange 153 is to be positioned beneath the main plane of the bottom 141 of the bottom cover 14.

According to another characteristic of the invention, the connection points of the electronic board, on which electrical links of each connector 15 pass through the internal extensions 152, and hence the corresponding orifice 220, are electrically connected and laid out in the vicinity of one other, proximate to the center of the electronic board 3.

Figure 8:
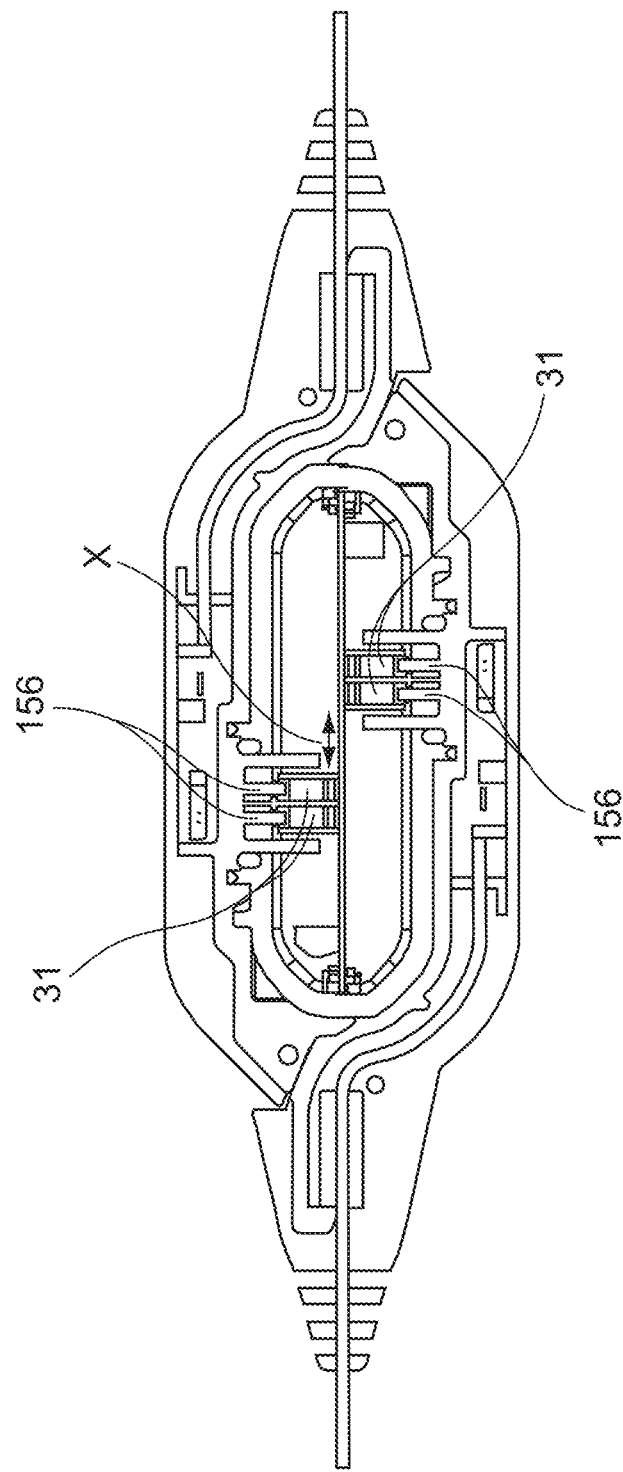

The proximity of the connection points 15 helps for a more robust implementation of the board. Transmission inputs go through the connectors, but also environmental constraint such as electrical discharge from lightening. In this case, the best option is to conduct the discharge through the node so it could be dissipated afterwards in a ground link. To minimize the failure risk during discharge conducting, it is required to reduce as much as possible the track length between the two connectors on the electronic board. Due to the huge current intensity, these tracks are very large and therefore very consumer of surface on the board. For instance, according to one embodiment of the present invention, the distance X (FIG. 8) between the two connectors 15 is in the order of 12 mm whereas in the existing solution of art the distance equals to 65 mm. Thus, having the two connectors in the vicinity of one another optimizes the board robustness against lightening, and limit the surface required for the tracks used to conduct lightning currents.

It can be noted that the link between the top cover 2 and the connectors 15 is a floating link. This link relies on the radial stiffness of the O-rings used.

Figure 9:
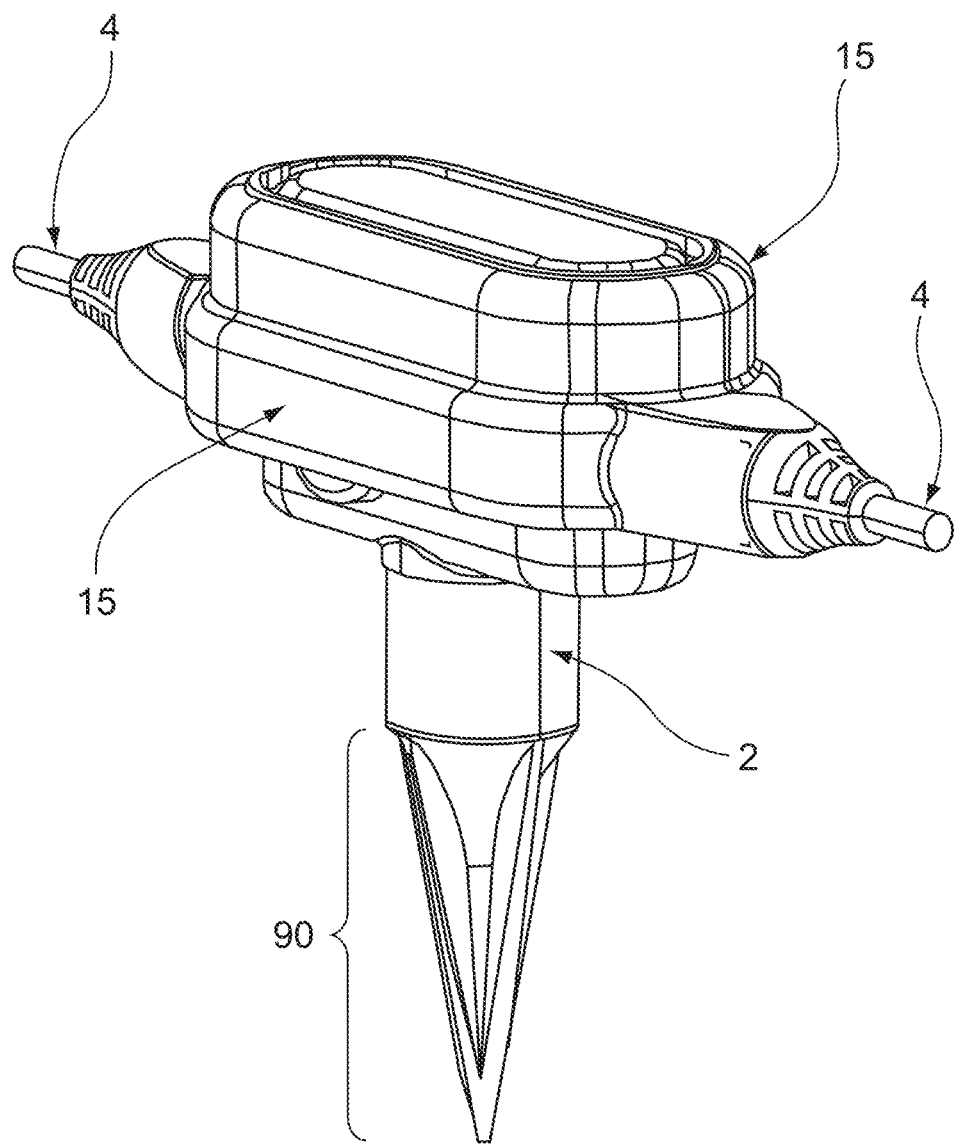
FIG. 9 is a schematic view of one other embodiment of one electronic module according to the present invention.

It is also to be noted that the invention can be applied to a seismic sensor of the type illustrated by FIG. 9. In this embodiment, the electronic module 1 comprises a bottom cover 14, an electronic board (not shown in FIG. 9) and a top cover 2. The top cover 2, the bottom cover 14 and the electronic board form a sub-assembly. This sub-assembly is then surrounded by the connectors 15 to form a shell in which the electronic board is placed. The sensors are integrated inside said top cover 2. The top cover 2 may also comprise a spike 90 to facilitate it's insertion in the ground.

In addition to the advantages of the present invention as described above, the module of the invention is greatly improved in order to withstand the mechanical forces undergone during its use on the field. These advantages are described more in details below in reference to the FIGS. 4a, 4b, 5 and 6.

Figure 4A:
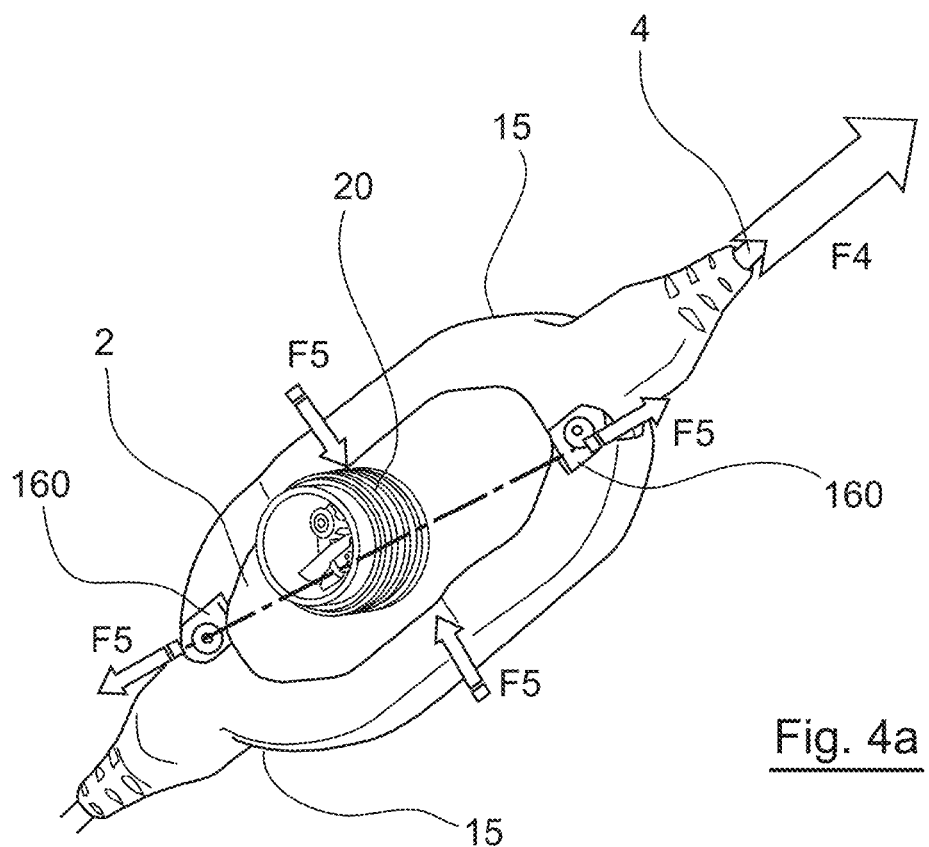
FIGS. 4a and 4b represent schematic views of the assembled electronic module behavior under compressive and traction stresses.
Figure 4B:
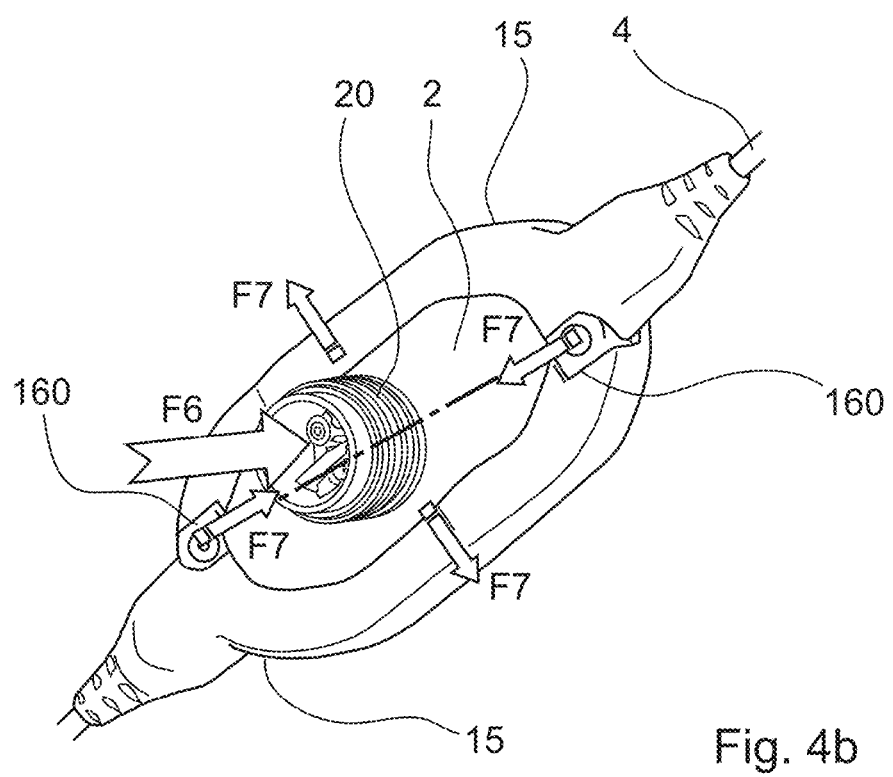

The assembly according to the invention makes it possible, when it is subjected to a tensile force on the section cable 4 or a compressive force on the top cover 2 to propagate the forces along a particular path and to concentrate the stresses at particular points. FIGS. 4a and 4b explain this principle.

In FIG. 4a, the tensile force applied to the cable is indicated by the arrow F4 while the resultant forces are indicated by the arrows F5.

In FIG. 4b, the compressive force applied to the top cover 2 is illustrated by the arrow F6, while the forces resulting from the applied stress are indicated by the arrows F7.

It can be noted than in both cases, the stresses are exerted firstly on the longitudinal walls 230 (FIG. 3) of the top cover 2 and secondly on the threads 160 of the connectors 15. However, for a same zone in which a resultant force is exerted, the corresponding force of compression is in a direction opposite that of the tensile force.

Thus, unlike solution of the previous art, a module according to the invention which undergoes forces as described in FIGS. 4a and 4b will minimize the resulting forces applied on the electronic board.

Figure 6:
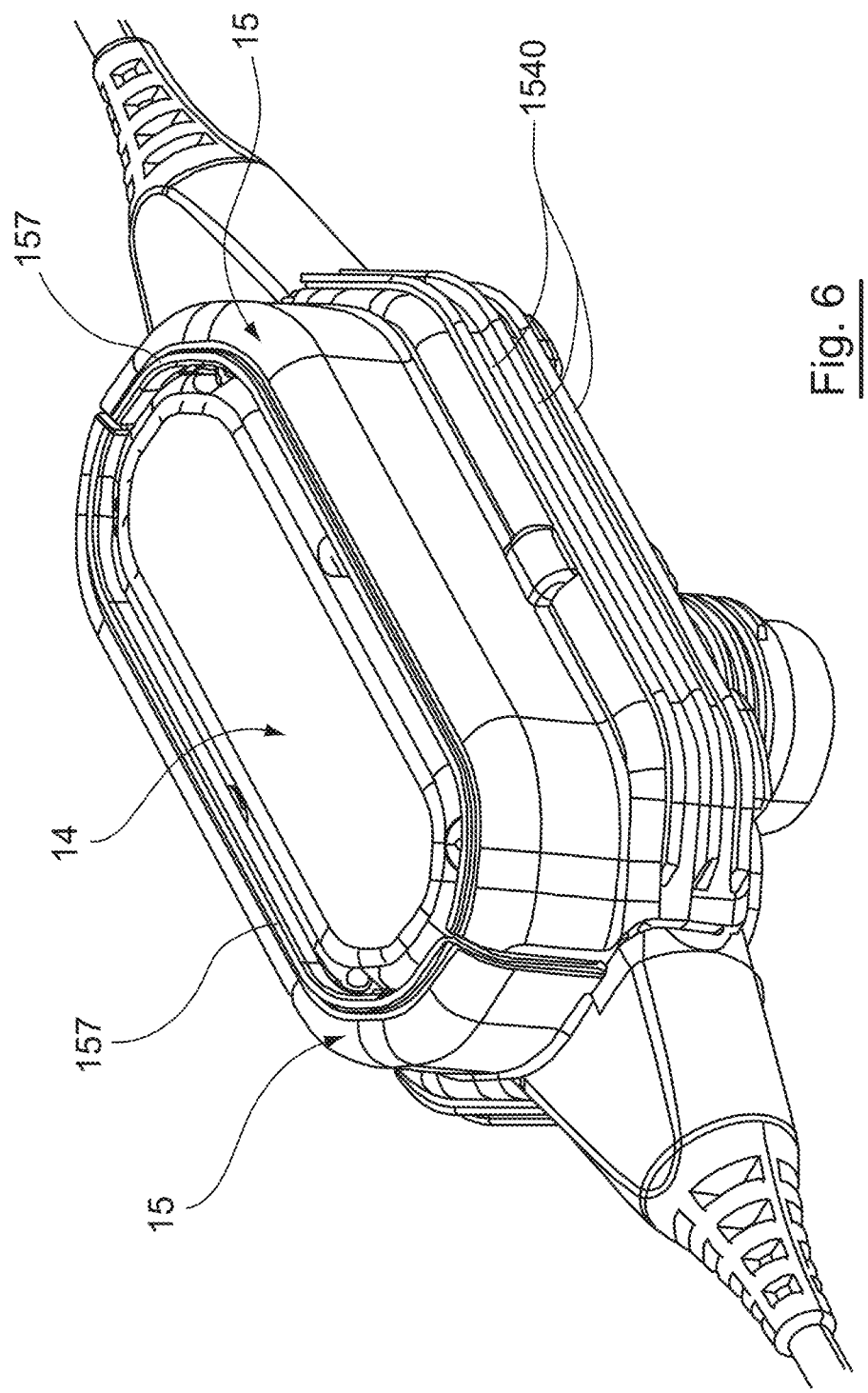
FIG. 6 is a view of the bottom cover of the electronic module described in FIG. 3.

The external face 154 of the connectors 15 according to the invention is made out of a flexible material. As illustrated by FIG. 6, external faces 154 may be provided with one or more strips 1540 of a flexible material. The preferred materials are soft polymers like soft plastics such as polyurethane, for instance reference Lubrizol Estaloc T58887 which is characterized by its soft hardness of 90 Shore A (or 50 Shore D); and its ability to be overmolded on the rigid sole 155 of the connector 15. The rigid sole is characterized by its hardness in the range of 75 Shore D.

During a lateral impact of the electronic module 1 on the ground, the flexible material serves as a shock absorber for the top cover 2 and consequently limits the acceleration undergone by the electronic board 3 and its components. The deformation of the board 3 is thus limited and the robustness of the assembly is improved. Furthermore, the external geometry of the connectors 15 can be adapted by creating major deformation zones, for example edges, which will act as shock absorbers for the top cover 2 during a lateral fall. In comparison to prior art solution (FIG. 1), the design of the electronic module of the present invention allows to increase the probability to reach a contact on edges.

During a vertical impact, in order to minimize the deformation of the board said board is positioned vertically in order to present the maximum inertia in the direction of the acceleration. This limits the deformations of the electronic board 3 to the utmost and gives the assembly the greatest robustness.

As illustrated by FIG. 6, the lower face of the connectors 15 is also provided with one strip 157 of a flexible material. Once the two connectors 15 are assembled, the strips 157 of the two connectors 15 surround the bottom cover 14 and define a periphery with a length of approximately 260 mm. Moreover, the strips may present a thickness of 3 mm over the bottom cover 14 and a width of 2 mm (for example). Thus, in case of vertical impact (such as FIG. 2a), the bottom cover 14 does not contact the ground and is protected by the strips 157, which tend to absorb the shock. This configuration of the module 1 allows to minimize the stress induced by the electronic board.

When the module is thrown on the ground, this last behaves like an equivalent "mass/spring" system when it hits the ground. The acceleration to which the module is subjected in a vertical fall is function of the stiffness K of the component undergoing the impact, of its mass and of its velocity at the impact x. K is defined as follow:

$$K=E*S/T$$

with E the Young's modulus, S the surface of the component and T the thickness of the component.

Thus, Newton's principle implies that if K increases, the acceleration also increases and, conversely, if K decreases, the acceleration decreases as well.

Figure 2A:
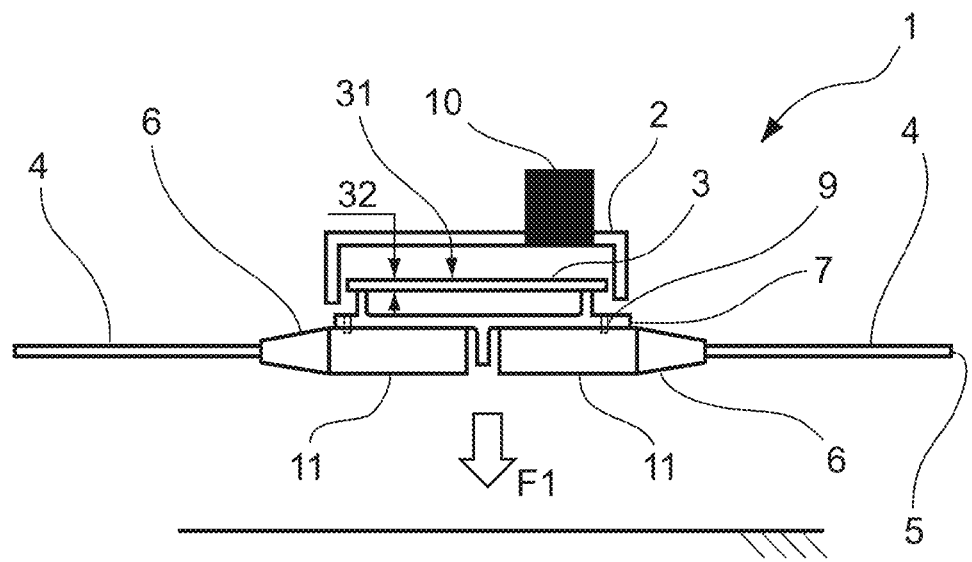
FIGS. 2a-f represent schematic side-views of the prior art electronic module of FIG. 1 in different configurations with different stresses undergone by the module.
Figure 2B:
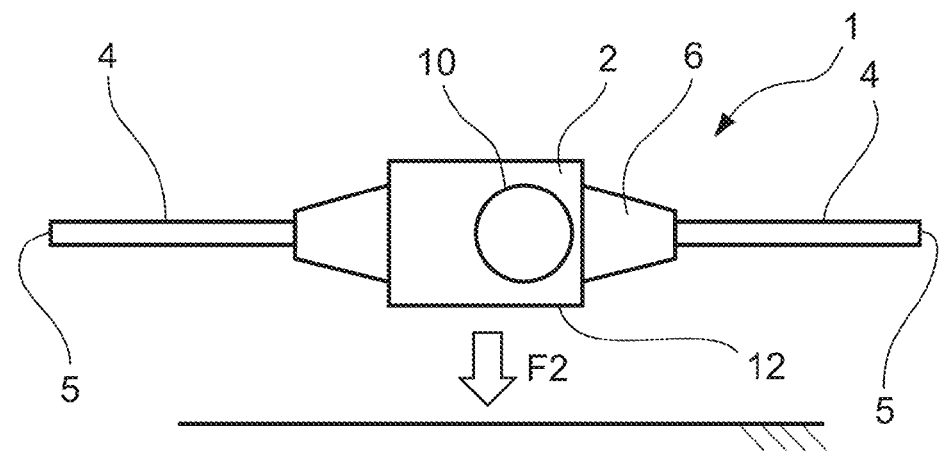
Figure 2C:
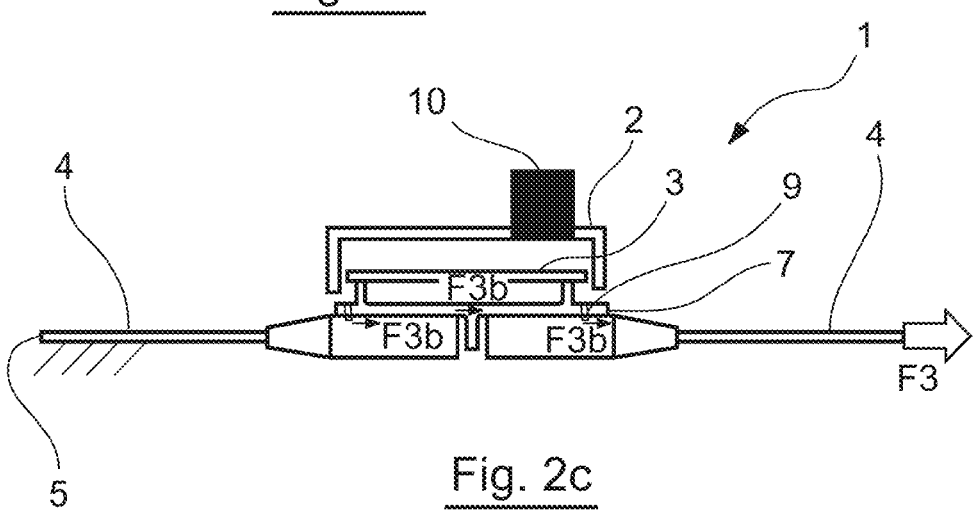
Figure 2D:
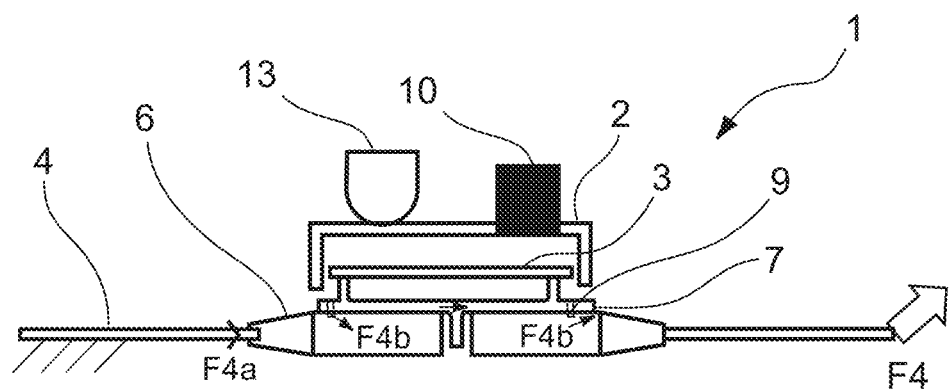
Figure 2E:
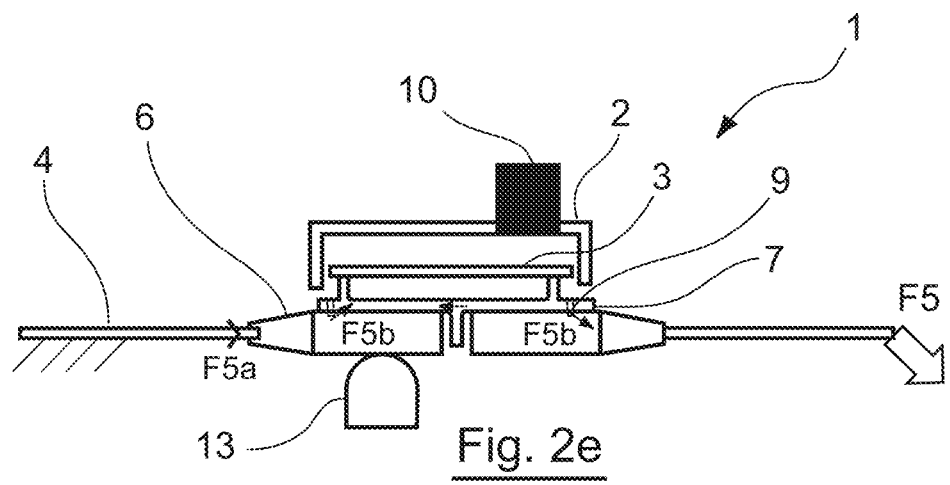
Figure 2F:
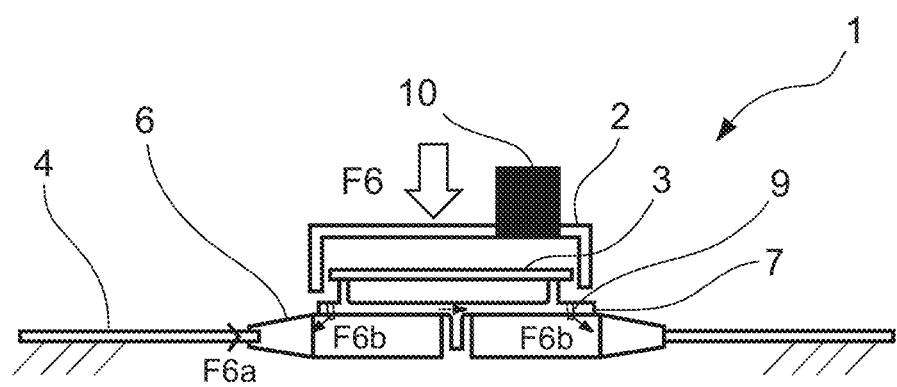

In the configuration of FIG. 2a, we obtain K=495 E N/mm (length W=110 mm, width=45 mm and thickness T=10 mm).

In the configuration of FIG. 6, with such dimensions of the strips 157, the surface of the strip which can undergo one impact is 520 mm$^2$ (2*260). So, as defined above, the stiffness K of the strips is K=173 E N/mm (length W=260 mm, width=2 mm and thickness T=3 mm).

In conclusion, the value of K is 2.9 more important in the configuration of FIG. 2a compared to the configuration of FIG. 6.

As can be seen, one parameter adapted to improve the behavior of the module is the stiffness K of the part of the module in contact with the ground during an impact.

Thus, with a module 1 according to the invention, the mechanical resistance is improved and therefore the deformation of the electronic board 3 during a vertical impact is minimized.

Figure 5:
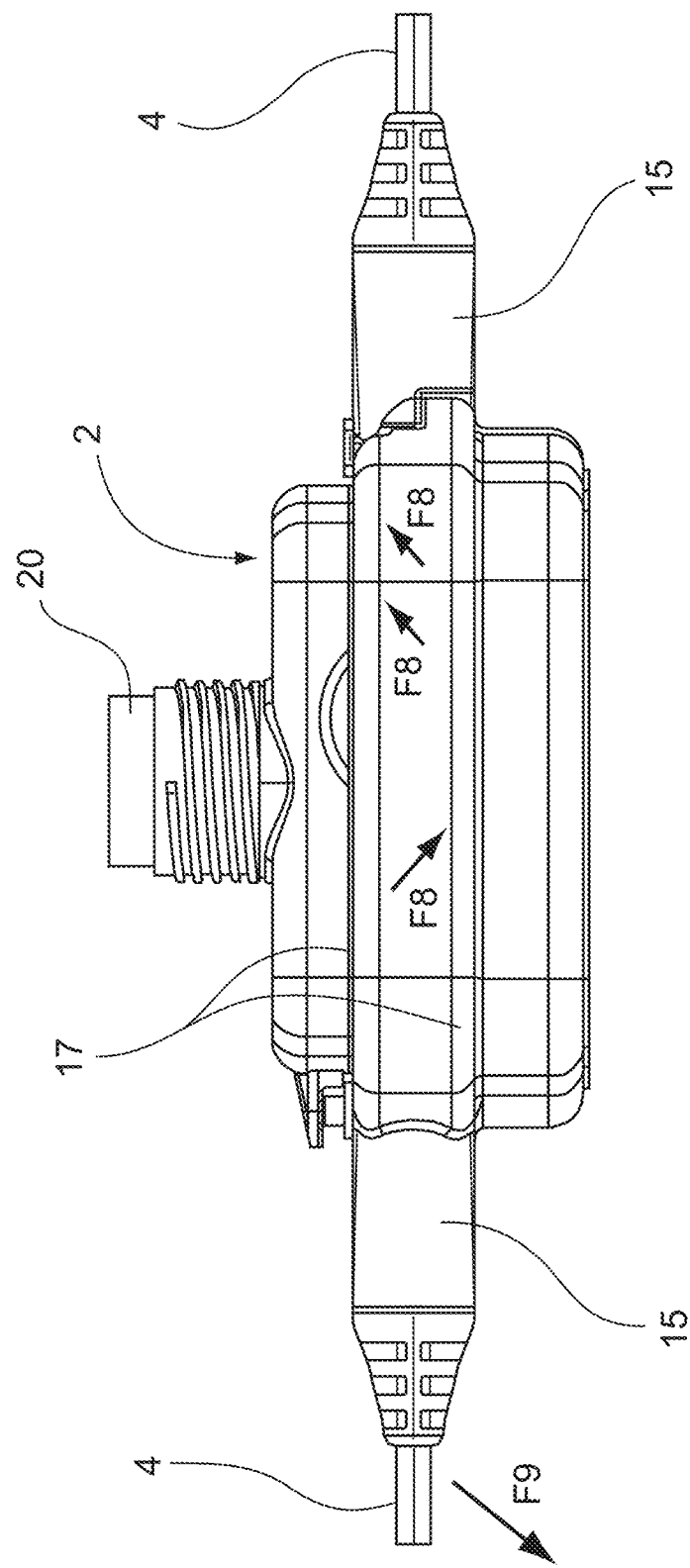
FIG. 5 is a schematic side view of the assembled electronic module behavior under one bending stress and the forces exerted on the top cover.

FIG. 5 represents the forces during a bending stress applied to the acquisition module 1 as illustrated by the arrow F9 which indicates an example of bending. Whether this stress is oriented upwards or downwards relative to the module, the stresses generated in the module are identical. Bending stresses could generally be decomposed in two components: a purely horizontal component and a purely vertical component. The horizontal component is a tensile force. Therefore, as described previously, the connector 15 rest on the peripheral surfaces referenced 230 on FIG. 3 of the top cover 2. Submitted to vertical forces, the connector 15 rest on faces referenced 240 and 250 on FIG. 3.

Therefore, in the present invention, the forces are absorbed and transmitted only by compression of one component on another. This prevents any fasteners from being stressed.

To summarize, the invention brings together all the following advantages.

The electronic module and the cable sections and connectors are assembled so as to be sliding about the top cover. The links between the top cover and the connectors are sliding supports or flexible links. This assembly makes the sealing functions more tolerant to deformations that appear under stress. The radial watertightness is defined as a compression of the sealing by two parts which are inserted one into another. It allows to tolerate more easily deformation with a dedicated and well dimensioned O-ring, whereas an axial watertightness, defined by a compression of the sealing by two parts compressing one onto the other, are less tolerant in terms of deformation. The use of radial waterproofness allows the connectors 15 from sliding under tension on the top cover 2, and rest on dedicated areas.

The connectors are fixed to one another rigidly. This makes the tensile forces exerted on the cable travel preponderantly through connectors and prevents them from exerting stress on the top cover. The robustness of the acquisition module is thereby improved under a tensile stress.

The connectors rest on certain faces of the top cover and the stresses generated on this top cover are actually compressive stresses for which the limit stress is beyond the ultimate tensile stress for a plastic material. This innovation therefore improves the robustness of the acquisition module under a bending stress.

The assembling of the electronic module to the connectors is simplified: the number of fastenings is limited, preferably to one or two, providing for a gain in assembly time in manufacturing or in the field.

The vertical positioning of the board in the sub-assembly maximizes its moment of inertia in the vertical axis of the acquisition module. The deformation of this board during a vertical impact is minimized.

Because of the non-plane surface of the connectors, their lateral positioning reduces the lateral acceleration undergone by the electronic board and the components during a lateral impact.

Thanks to flexible material placed on the external face of the connector, the top cover is less sensitive to the resultant force of the shocks.

An exemplary embodiment of the invention provides electronic modules with greater tolerance to construction set and deformation that appear under stress.

An exemplary embodiment of the invention simplifies the assembling of electronic board and associated cover with the connectors. Thus, troubleshooting time in the field can be reduced.

An exemplary embodiment of the invention improves the mechanical reliability of the components of the acquisition module.

An exemplary embodiment of the invention reduces the lateral acceleration undergone by the electronic board and the electronic components during a lateral impact.

Although the present disclosure has been described with reference to one or more examples, workers skilled in the art will recognize that changes may be made in form and detail without departing from the scope of the disclosure and/or the appended claims.

The invention claimed is:

1. A module for processing geophysical data coming from at least one geophysical sensor, said module comprising:
    an electronic board configured to enable the processing of geophysical data captured by said at least one geophysical sensor,
    two cable sections each comprising, at one extremity, a connector designed to be connected to said electronic board, wherein each connector forms one half-shell, each connector being arranged so as to cooperate with one other half-shell in such a way as to form a shell in which the electronic board is placed.

2. The module according to claim 1, comprising a top cover and a bottom cover arranged so as to form a sub-assembly in which the electronic board is placed.

3. The module according to claim 2, wherein said sub-assembly is held by the shell-forming connectors.

4. The module according to claim 2, wherein the bottom cover, the top cover and the connectors cooperate so as to form a tightly sealed shell around the electronic board.

5. The module according to claim 4, wherein said top cover comprises an orifice compared with each face of the electronic board, providing each with a link between one of the connectors and one connection point of the board.

6. The module according to claim 1, wherein the electronic board is positioned longitudinally along one axis formed by the cable sections, laterally surrounded by the shell-forming connectors.

7. The module according to claim 1, wherein the connectors forming said shell are identical and are positioned in a symmetrical position with regard to said axis.

8. The module according to claim 1, wherein the electronic board extends vertically between the shell-forming connectors.

9. The module according to claim 2 said bottom cover comprises at least one slot arranged so as to hold the electronic board vertically.

10. The module according to claim 1, wherein said electronic board comprises at least one electrical connection point for each connector, said at least one electrical connection points being laid out in a central region of said electronic board.

11. The module according to claim 10, wherein the electrical connection points of the electronic board are laid out in the vicinity of one other.

12. The module according to claim 1, wherein each connector comprises an external face made out of flexible material and an internal face made out of rigid material.

13. The module according to claim 1, wherein each connector comprises a strip at its lower face made out of flexible material.

14. The module according to claim 12, wherein the hardness of said external face and internal face respectively belong to the ranges of 60 to 90 Shore A and 60 to 90 Shore D.

15. The module according to claim 1, wherein said at least one geophysical sensor comprises at least one geophone.

16. The module according to claim 1, wherein said at least one geophysical sensor comprises at least one MEMS sensor.

17. The module according to claim 1, wherein each cable section comprises:
- one end-of-section hermaphrodite connector configured to be connected to one other end-of section hermaphrodite connector of one other cable section; and
- one connector providing an electrical link between the cable section and the electronic board.

18. The module according to claim 1, wherein each cable section comprises at each of its extremities one connector providing an electrical link between the cable section and the electronic board.

19. A connector forming a half-shell and arranged so as to cooperate with one other connector forming another half-shell so as to form a shell in which an electronic board of a module for processing geophysical data coming from at least one geophysical sensor is placed, wherein the module comprises an electronic board configured to enable the processing of geophysical data captured by said at least one geophysical sensor, and two cable sections each comprising, at one extremity, said connector designed to be connected to said electronic board.

20. A sub-assembly comprising:
- a bottom cover and a top cover configured to cooperate together;
- an electronic board placed and held by said top and bottom cover; and
- first and second cable sections each comprising, at one extremity, a connector designed to be connected to said electronic board, wherein each connector forms one half-shell, each connector being arranged so as to cooperate with one other half-shell in such a way as to form a shell in which the electronic board is placed.

* * * * *